(12) United States Patent
Liao et al.

(10) Patent No.: US 8,545,289 B2
(45) Date of Patent: Oct. 1, 2013

(54) DISTANCE MONITORING DEVICE

(75) Inventors: Chien-Mao Liao, Taipei County (TW); Yi-Nan Chen, Taipei (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 390 days.

(21) Appl. No.: 13/086,367

(22) Filed: Apr. 13, 2011

(65) Prior Publication Data

US 2012/0264354 A1 Oct. 18, 2012

(51) Int. Cl.
B24B 49/00 (2012.01)
(52) U.S. Cl.
USPC .................................... 451/5; 451/8; 451/288
(58) Field of Classification Search
USPC ............... 451/1, 5, 6, 8, 9, 41, 285–290, 384, 451/390, 398
See application file for complete search history.

(56) References Cited

U.S. PATENT DOCUMENTS

| | | | |
|---|---|---|---|
| 6,077,437 A * | 6/2000 | Hayashi et al. ............... | 210/651 |
| 6,328,629 B1 * | 12/2001 | Togawa et al. .................... | 451/8 |
| 6,945,845 B2 * | 9/2005 | Bennett et al. .................... | 451/5 |
| 7,048,609 B2 * | 5/2006 | Togawa .............................. | 451/5 |
| 8,080,797 B2 * | 12/2011 | Vogt et al. .................. | 250/338.4 |
| 2002/0049024 A1 * | 4/2002 | Zuniga et al. ..................... | 451/8 |
| 2003/0061865 A1 * | 4/2003 | Choi et al. .......................... | 73/49 |
| 2004/0203328 A1 * | 10/2004 | Tada et al. ..................... | 451/285 |
| 2005/0070205 A1 * | 3/2005 | Korovin et al. .................... | 451/5 |
| 2005/0287929 A1 * | 12/2005 | Swedek et al. ..................... | 451/5 |
| 2006/0194511 A1 * | 8/2006 | Nagayama et al. ............... | 451/5 |
| 2007/0051619 A1 * | 3/2007 | Mazur et al. .................. | 204/250 |
| 2007/0232193 A1 * | 10/2007 | Yasuda et al. ...................... | 451/5 |
| 2008/0102732 A1 * | 5/2008 | Severson et al. ................... | 451/5 |
| 2008/0188162 A1 * | 8/2008 | Kobata et al. ..................... | 451/8 |
| 2008/0287043 A1 * | 11/2008 | Saito et al. ..................... | 451/285 |
| 2009/0104847 A1 * | 4/2009 | Kobayashi et al. ............... | 451/5 |
| 2009/0181475 A1 * | 7/2009 | Akasako ........................... | 438/5 |
| 2009/0239446 A1 * | 9/2009 | Fukuda et al. ..................... | 451/5 |
| 2010/0093260 A1 * | 4/2010 | Kobayashi et al. ............... | 451/5 |
| 2010/0112901 A1 * | 5/2010 | Togawa et al. .................... | 451/5 |
| 2010/0330878 A1 * | 12/2010 | Kobayashi et al. ............... | 451/5 |
| 2011/0159783 A1 * | 6/2011 | Fukushima et al. ............. | 451/11 |
| 2012/0064800 A1 * | 3/2012 | Watanabe et al. ................. | 451/5 |
| 2012/0064801 A1 * | 3/2012 | Xu et al. ............................ | 451/6 |
| 2012/0088438 A1 * | 4/2012 | Tada et al. ......................... | 451/5 |
| 2012/0164917 A1 * | 6/2012 | Kobata et al. ..................... | 451/6 |
| 2012/0309277 A1 * | 12/2012 | Yasuda et al. ................. | 451/364 |
| 2012/0316445 A1 * | 12/2012 | Machida et al. .............. | 600/459 |

\* cited by examiner

Primary Examiner — Joseph J Hail
Assistant Examiner — Marc Carlson
(74) Attorney, Agent, or Firm — Jianq Chyun IP Office

(57) ABSTRACT

A distance monitoring device is provided. The device is suitable for a chemical mechanical polishing (CMP) apparatus. A polishing head of the CMP apparatus includes a frame and a membrane. The membrane is mounted on the frame, and a plurality of air bags is formed by the membrane and the frame in the polishing head. The distance monitoring device includes a plurality of distance detectors disposed on the frame corresponding to the air bags respectively to set a location of each of the distance detectors on the frame as a reference point, wherein each of the distance detectors is configured to measure a distance between each of the reference points and the membrane.

11 Claims, 2 Drawing Sheets

DISTANCE MONITORING DEVICE

BACKGROUND OF THE INVENTION

1. Field of the Invention

The invention is related to a distance monitoring device and more particularly to a distance monitoring device used in a chemical mechanical polishing apparatus.

2. Description of Related Art

Because the resolution of photolithography exposure increases along with the decrease in device size and the depth of field at exposure is reduced, the requirement to evenness of chip surface increases drastically. Thus, when performing the deep sub-micron process, the planarization of the chip then depends on the chemical mechanical polishing (CMP) process. The unique anisotropic polishing property of the CMP process is not only used for the planarization of the surface contour of the chip, but can also be applied in the fabrication of damascene structures of perpendicular and horizontal metal interconnections, the fabrication of shallow trench isolations in devices and the fabrication of advanced devices in the previous stage, and the fabrication of micro-electromechanical system planarization and the fabrication of flat displays, etc.

The CMP process mainly utilizes a reagent in the polishing slurry for generating a chemical reaction on the front side of the wafer to form a polishable layer. Further, with the wafer on the polishing pad, the protruding portions of the polishable layer are polished off by the mechanical polishing with the facilitation of abrasive particles in the polishing slurry. The chemical reactions and the mechanical polishing are then repeated to form a planar surface.

Nevertheless, the bending level of the wafer becomes higher as the rigidity of the wafer becomes lower. When the wafer bends, the polishing rates in various regions of the wafer are different under the CMP process, such that the surface of the wafer has unfavorable flatness.

SUMMARY OF THE INVENTION

The invention is directed to a distance monitoring device capable of detecting a surface flatness of a substrate during a polishing in real time.

The invention is directed to a distance monitoring device suitable for a chemical mechanical polishing (CMP) apparatus. A polishing head of the CMP apparatus includes a frame and a membrane. The membrane is mounted on the frame and a plurality of air bags is formed by the membrane and the frame in the polishing head. The distance monitoring device includes a plurality of distance detectors disposed on the frame corresponding to the air bags respectively to set a location of each of the distance detectors on the frame as a reference point. Each of the distance detectors is configured to measure a distance between each of the reference points and the membrane.

According to an embodiment of the invention, the distance monitoring device further includes a gas supply and a distance controller. The gas supply communicates to the air bags. The distance controller is coupled to the distance detectors and the gas supply to determine a gas flow rate communicating from the gas supply to the air bags according to data feedback from the distance detectors so as to control a pressure in the air bags.

According to an embodiment of the invention, in the distance monitoring device, the gas supply is a pump, for example.

According to an embodiment of the invention, the distance monitoring device further includes a plurality of gas pipes communicating the gas supply and the air bags respectively.

According to an embodiment of the invention, in the distance monitoring device, the distance detector is a non-contact distance detector or a contact distance detector, for example.

According to an embodiment of the invention, in the distance monitoring device, the non-contact distance detector is an electromagnetic impedance detecting device, a laser transmitting and receiving device, or an ultrasound transmitting and receiving device, for instance.

According to an embodiment of the invention, in the distance monitoring device, the contact distance detector is a stylus device, for example.

According to an embodiment of the invention, in the distance monitoring device, the air bags are disposed co-axially, for instance.

According to an embodiment of the invention, in the distance monitoring device, a material of the frame is a rigid material, for example.

According to an embodiment of the invention, in the distance monitoring device, the membrane is an elastic membrane, for instance.

According to an embodiment of the invention, in the distance monitoring device, each of the distances is a parameter on recipe setting, for instance.

In light of the foregoing, the distance monitoring device disclosed in the invention is capable of measuring a distance between each of the reference points and the membrane in real time. Moreover, the membrane tightly adheres to the substrate during the polishing to show the surface flatness of the substrate. Accordingly, the surface flatness of the substrate during the polishing can be detected in real time through the distance monitoring device.

In order to make the aforementioned and other features of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

Figure 1:
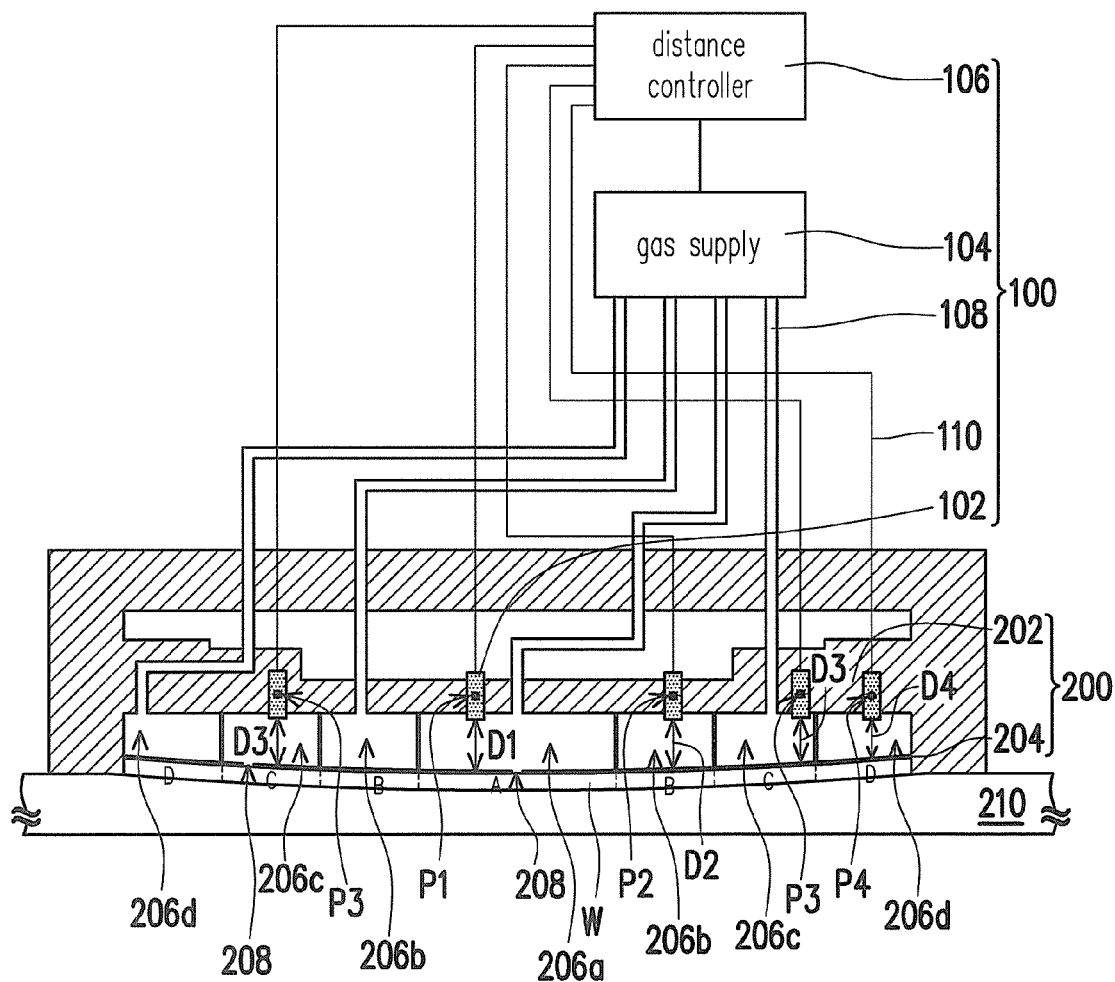
FIG. 1 illustrates a cross-sectional view of a distance monitoring device according to one embodiment of the invention.
Figure 2:
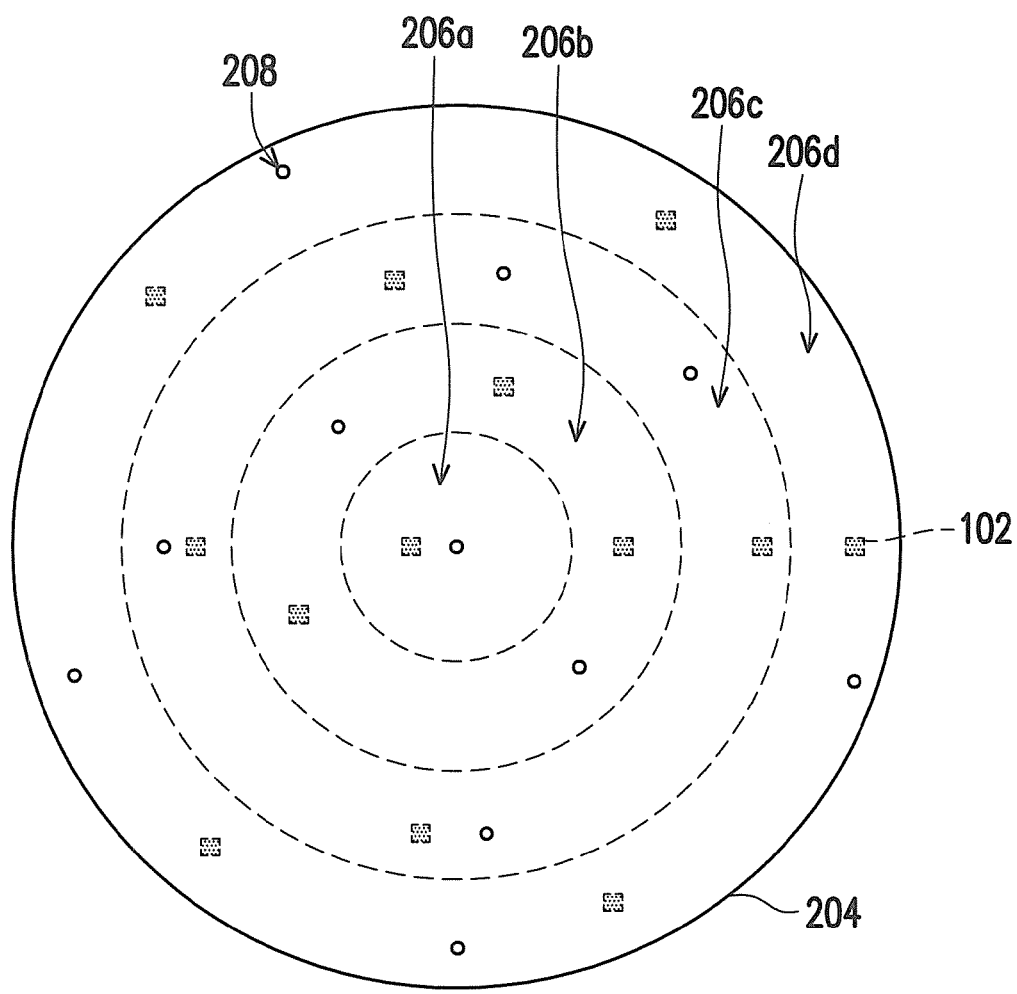
FIG. 2 depicts a front view of a membrane in FIG. 1 and shows a relationship of a disposition between a plurality of air bags and the distance monitoring device.

FIG. 1 illustrates a cross-sectional view of a distance monitoring device according to one embodiment of the invention. FIG. 2 depicts a front view of a membrane in FIG. 1 and shows a relationship of a disposition between a plurality of air bags and the distance monitoring device.

Referring to FIGS. 1 and 2, a distance monitoring device 100 is suitable for a chemical mechanical polishing (CMP) apparatus. In the present embodiment, a substrate being polished is a wafer W, for example. A polishing head 200 of the chemical mechanical polishing apparatus includes a frame 202 and a membrane 204. The membrane 204 is mounted on the frame 202. The membrane 204 and the frame 202 form a plurality of air bags 206a, 206b, 206c, 206d in the polishing head 200. The frame 202 is fabricated using a rigid material. The membrane 204 is, for example, an elastic membrane. The membrane 204 is fabricated using rubber, for instance. The membrane 204 includes an opening 208 for facilitating a vacuum adsorption on a wafer W, for example. The air bags 206a, 206b, 206c, 206d are disposed co-axially, for example. In the present embodiment, 4 air bags are shown for illustration; however, the distance monitoring device is protected by the scope of the invention as long as the amount of the air bags is 2 or more.

The distance monitoring device 100 includes a plurality of distance detectors 102 disposed on the frame 202 corresponding to the air bags 206 respectively. A plurality of locations of the distance detectors 102 on the frame 202 is set as a plurality of reference points P1, P2, P3, P4. The distance detectors 102 are configured to measure a plurality of distances D1, D2, D3, D4 between the reference points P1, P2, P3, P4 and the membrane 204 respectively. Each of the distances D1, D2, D3, D4 is a parameter on recipe setting, for example. Each of the air bags 206 corresponds to at least one distance detector 102. In other words, each of the air bags 206 can correspond to one or more distance detectors 102. The distance detector 102 is, for example, a non-contact distance detector or a contact distance detector. Herein, the non-contact distance detector is an electromagnetic impedance detecting device, a laser transmitting and receiving device, or an ultrasound transmitting and receiving device, for instance. The contact distance detector is, for example, a stylus device.

The distance monitoring device 100 optionally includes a gas supply 104 and a distance controller 106 to control the pressure in the air bags 206a, 206b, 206c, 206d.

The gas supply 104 communicates to the air bags 206a, 206b, 206c, 206d. The gas supply 104 is, for example, a pump. In addition, the distance monitoring device 100 optionally includes a plurality of gas pipes 108 communicating to the gas supply 104 and the air bags 206a, 206b, 206c, 206d respectively.

The distance controller 106 is coupled to the distance detectors 102 and the gas supply 104 to determine a gas flow rate communicating from the gas supply 104 to the air bags 206a, 206b, 206c, 206d according to data feedback from the distance detectors 102 so as to control the pressure in the air bags 206a, 206b, 206c, 206d. The distance controller 106 is coupled to the distance detectors 102 and the gas supply 104 through a signal line 110, for example.

In the following, an operation mechanism of the distance monitoring device 100 is illustrated. Herein, the wafer W is adopted as the substrate for chemical mechanical polishing in the illustration; however, the scope of the invention is not limited thereto.

Referring to FIG. 1, firstly, when the wafer W is being polished, the wafer W is placed on a polishing pad 210 of the chemical mechanical polishing apparatus using the polishing head 200 through methods such as vacuum adsorption and so on. The wafer W is divided into regions A, B, C, D in correspondence to the air bags 206a, 206b, 206c, 206d.

Thereafter, the membrane 204 of the polishing head 200 is utilized for pressing the wafer W onto the polishing pad 210 for polishing. At the same time, the gas supply 104 is applied for communicating a gas into the air bags 206a, 206b, 206c, 206d so as to pressurize the wafer W through the membrane 204 to facilitate the polishing.

When the wafer W is polished adopting the polishing pad 210, the distance detectors 102 of the distance monitoring device 100 measure the distances D1, D2, D3, D4 between the reference points P1, P2, P3, P4 and the membrane 204 in real time. Since the membrane 204 is tightly adhered to the wafer W, the surface flatness of the entire wafer W can be detected through the changes in the distances D1, D2, D3, D4 in the air bags 206a, 206b, 206c, 206d.

Afterwards, the distance detectors 102 send the data measured back to the distance controller 106. The distance controller 106 then determines a gas flow rate communicating from the gas supply 104 to the air bags 206a, 206b, 206c, 206d according to the data received to control the pressure in the air bags 206a, 206b, 206c, 206d. For instance, when the distance D1 measured by the distance detector 102 corresponding to the air bag 206a is larger than a setting value, the wafer W in the region A is over-polished. At the time, the distance controller 106 decreases the gas flow rate communicating from the gas supply 104 to the air bag 206a to reduce the pressure in the air bag 206a, thereby decreasing the polishing rate in the region A. When the distance D4 measured by the distance detector 102 corresponding to the air bag 206d is smaller than a setting value, the wafer W in the region D is under-polished. At the time, the distance controller 106 increases the gas flow rate communicating from the gas supply 104 to the air bag 206d to increase the pressure in the air bag 206d, thereby increasing the polishing rate in the region D.

According to the embodiment described above, as the distance detectors 102 in the distance monitoring device 100 is capable of measuring the distances D1, D2, D3, D4 between the reference points P1, P2, P3, P4 and the membrane 204 in real time, the surface flatness of the wafer W during the polishing can be detected in real time through the distance detectors 102.

Additionally, when the distance monitoring device 100 has the distance controller 106, the distance controller 106 then determines the gas flow rate communicating from the gas supply 104 to the air bags 206a, 206b, 206c, 206d according to the data feedback from the distance detectors 102. Consequently, the polishing rates in the regions A, B, C, D can be adjusted individually, so that the wafer W having better surface flatness can be obtained after the polishing process.

In summary, the embodiment includes at least the following features:

1. The distance monitoring device of the embodiments aforementioned is capable of detecting the surface flatness of the substrate in real time during the polishing.

2. When the distance monitoring device has a distance controller, the substrate having better surface flatness can be obtained after the polishing process.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A distance monitoring device suitable for a chemical mechanical polishing apparatus, wherein a polishing head of the chemical mechanical polishing apparatus comprises a frame and a membrane mounted on the frame, and a plurality of air bags is formed by the membrane and the frame in the polishing head, the distance monitoring device comprising:

a plurality of distance detectors disposed on the frame corresponding to the air bags respectively to set a location of each of the distance detectors on the frame as a reference point, wherein each of the distance detectors is configured to measure a distance between each of the reference points and the membrane.

2. The distance monitoring device as claimed in claim 1, further comprising:
- a gas supply, communicating the air bags; and
- a distance controller, coupled to the distance detectors and the gas supply to determine a gas flow rate communicating from the gas supply to the air bags according to data feedback from the distance detectors so as to control a pressure in the air bags.

3. The distance monitoring device as claimed in claim 2, wherein the gas supply comprises a pump.

4. The distance monitoring device as claimed in claim 2, further comprising a plurality of gas pipes communicating the gas supply and the air bags respectively.

5. The distance monitoring device as claimed in claim 1, wherein the distance detector comprises a non-contact distance detector or a contact distance detector.

6. The distance monitoring device as claimed in claim 5, wherein the non-contact distance detector is an electromagnetic impedance detecting device, a laser transmitting and receiving device, or an ultrasound transmitting and receiving device.

7. The distance monitoring device as claimed in claim 5, wherein the contact distance detector comprises a stylus device.

8. The distance monitoring device as claimed in claim 1, wherein the air bags are disposed co-axially.

9. The distance monitoring device as claimed in claim 1, wherein a material of the frame comprises a rigid material.

10. The distance monitoring device as claimed in claim 1, wherein the membrane comprises an elastic membrane.

11. The distance monitoring device as claimed in claim 1, wherein each of the distances is a parameter on recipe setting.

* * * * *